US008025237B2

(12) United States Patent
Ochi et al.

(10) Patent No.: US 8,025,237 B2
(45) Date of Patent: Sep. 27, 2011

(54) ANTENNA BUILT-IN MODULE, CARD TYPE INFORMATION DEVICE, AND METHODS FOR MANUFACTURING THEM

(75) Inventors: Shozo Ochi, Osaka (JP); Norihito Tsukahara, Kyoto (JP); Yutaka Nakamura, Kyoto (JP); Hirohisa Tanaka, Mie (JP)

(73) Assignee: Panasonic Corporation, Osaka (JP)

( * ) Notice: Subject to any disclaimer, the term of this patent is extended or adjusted under 35 U.S.C. 154(b) by 561 days.

(21) Appl. No.: 12/161,185

(22) PCT Filed: Nov. 8, 2006

(86) PCT No.: PCT/JP2006/322244
§ 371 (c)(1),
(2), (4) Date: Jul. 17, 2008

(87) PCT Pub. No.: WO2007/083430
PCT Pub. Date: Jul. 26, 2007

(65) Prior Publication Data
US 2010/0163630 A1 Jul. 1, 2010

(30) Foreign Application Priority Data
Jan. 20, 2006 (JP) .................................. 2006-011786

(51) Int. Cl.
*G06K 19/06* (2006.01)

(52) U.S. Cl. ...................................... 235/492

(58) Field of Classification Search ................... 235/492, 235/493, 449; 343/787, 870, 895; 257/666; 713/310
See application file for complete search history.

(56) References Cited

U.S. PATENT DOCUMENTS

| 7,775,446 B2 * | 8/2010 | Ochi et al. ............... 235/492 |
| 2004/0023701 A1 | 2/2004 | Hankui ..................... 455/575.7 |
| 2004/0185901 A1 | 9/2004 | Kachi et al. ............... 455/556.1 |
| 2005/0007296 A1 | 1/2005 | Endo et al. ................ 343/895 |
| 2008/0111756 A1 * | 5/2008 | Ochi et al. ................ 343/788 |

FOREIGN PATENT DOCUMENTS

| EP | 1 347 533 | 9/2003 |
| JP | 2004-328610 | 11/2004 |
| JP | 2006-101494 | 4/2006 |
| WO | WO 2004/109852 A1 | 12/2004 |

* cited by examiner

*Primary Examiner* — Seung Lee
(74) *Attorney, Agent, or Firm* — Steptoe & Johnson LLP

(57) ABSTRACT

An antenna built-in module which incorporates an antenna, is thin and excellent in antenna characteristics, a card type information device and a method for manufacturing the same are provided. A wiring board (110) which has a wiring pattern (120) and in which an electronic component is mounted on at least one surface thereof, a magnetic substance (160) embedded in the other surface of the wiring board (110), an antenna pattern (170) provided on the magnetic substance (160), the wiring pattern (120) of the wiring board (110) and the antenna terminal electrode of the antenna pattern (170) are connected by a conductive via (200).

9 Claims, 9 Drawing Sheets

ANTENNA BUILT-IN MODULE, CARD TYPE INFORMATION DEVICE, AND METHODS FOR MANUFACTURING THEM

TECHNICAL FIELD

The present invention relates to an antenna built-in module readable and storable without contact, a card type information device, and methods for manufacturing them.

BACKGROUND ART

Recently, non-contact IC tag has been demanded in many fields including the physical distribution, and reduced costs and an increase in performance have been required therefor.

In addition, various mass storage memory cards have been widely used in portable digital equipment such as a digital camera, a portable music player or a portable information terminal along with the spread of the memory cards.

In recent years, to widen the application of a memory card further, it has been demanded to have a wireless communication function.

In response to such demands, an SD memory card (registered trademark) having a wireless interface function added thereto is disclosed (for example, see Japanese Unexamined Patent Application Publication No. 2001-195553).

The disclosed SD memory card incorporates not only a main functional unit as a storage medium but also a wireless controller, and is configured so that an antenna module formed of a loop antenna is connected to the wireless controller through an interface. A flash memory serving as a storage medium functions as a flash ROM for a memory used in the SD memory card, and stores a driver program for operating a wireless communication function.

With such a configuration, the SD memory card connected to the antenna module can communicate with an external wireless communication device since radio waves are transmitted and received to/from the antenna module by using the wireless communication function. In addition, a configuration in which the antenna module is built in a casing of the SD memory card is also disclosed.

In addition, an IC card which achieves a reduction in size and includes a transceiving coil for preventing communication failures therein is disclosed (for example, see Japanese Unexamined Patent Application Publication No. 8-16745).

The IC card is configured so that a magnetic substance having high magnetic permeability and high resistivity is deposited or adhered on a rear side of a substrate on which an IC chip and the transceiving coil are mounted. In addition, when the IC card mounted on a reading unit transmits and receives information, the magnetic substance prevents electric power loss of the reading unit caused by magnetic flux of an electromagnetic field of radio waves and an eddy current that is generated from a metallic conductor such as a battery. Specifically, the magnetic flux is shielded by the magnetic substance, and thus an occurrence of eddy current in the metal conductor caused by the magnetic flux is prevented.

In addition, in Japanese Unexamined Patent Application Publication No. 8-16745, there is also disclosed an IC card configured so that an IC chip is mounted on a first print board, a transceiving coil is formed on a second print board, and a magnetic substance is interposed between two print boards. With such a configuration, it is possible to increase the storage capacity due to enlargement of an area on which the IC chip is mounted, and it is also possible to miniaturize the IC card in a case where the storage capacity is not increased.

DISCLOSURE OF THE INVENTION

Problem that the Invention is to Solve

However, with the SD memory card disclosed in Japanese Unexamined Patent Application Publication No. 2001-195553, the antenna module is mounted externally, and thus the size of the SD memory card as a whole increases by the size of the antenna module. Hence, an additional space for the antenna module should be provided when the SD memory card is inserted into electronic devices such as a portable digital device, and thus there has been a problem in the miniaturization of the SD memory card. Accordingly, in order to achieve the miniaturization, there has been proposed a method in which, for example, a 2.4 GHz-band antenna having a short antenna length is built in the SD memory card along the end face thereof on which an external connection terminal is not provided. However, an antenna length is large in a general IC card using, for example, 13.56 MHz band, and thus it is difficult to secure antenna sensitivity or to form an antenna pattern.

In addition, with the IC card disclosed in the Japanese Unexamined Patent Application Publication No. 8-16745, an IC chip and a transceiving coil are formed on a print board surface, and thus there has been a problem that received radio waves are reflected by the IC chip, radio waves incident on the transceiving coil diminish, and thus the receivable distance of the transceiving coil decreases. To solve the problem, in Japanese Unexamined Patent Application Publication No. 8-16745, there is shown a configuration in which the transceiving coil and the IC chip are separated from each other by a magnetic substance. However, since the configuration employs two print boards, it is difficult to decrease the thickness of the IC card. Particularly, in card type information devices such as an SD memory card, an outward shape thereof is generally standardized, and thus it is a significant issue how to achieve a decrease in thickness.

The invention has been made in order to solve the problems, and its object is to provide an antenna built-in module which is thin and in which an antenna having excellent antenna characteristics is built, a card type information device and methods for manufacturing them.

Means for Solving the Problems

To solve the problems mentioned above, according to an aspect of the invention, an antenna built-in module includes: a wiring board which has a wiring pattern and of which at least one surface has an electronic component mounted thereon; a magnetic substance which is embedded in the other surface of the wiring board; an antenna pattern which has an antenna terminal electrode formed on the magnetic substance of the wiring board; and a conductive via which connects the antenna terminal electrode and the wiring pattern on the wiring board.

In addition, the antenna terminal electrode may be formed on a position other than that of the magnetic substance.

In addition, the electronic component includes at least a semiconductor storage element and a control element.

With these configurations, the magnetic substance is embedded in a concave portion of the wiring board provided on a surface opposite the surface on which the electronic components are mounted, and so the wiring pattern is formed on the magnetic substance. Thus, it is possible to achieve an antenna built-in module which is thin and has excellent antenna characteristics.

In addition, an external connection terminal is formed on the wiring board.

In addition, a connection substrate having an external connection terminal is formed on the wiring board.

With these configurations, it is possible to realize an antenna built-in module having both of non-contact type and contact type functions.

In addition, the magnetic substance is formed on at least a region provided with a plurality of the electronic components.

With the configuration, it is possible to improve antenna characteristics by preventing reflection of radio waves from the electronic components.

According to another aspect of the invention, a card type information device includes the antenna built-in module mounted in a casing.

With the configuration, it is possible to obtain a contact or non-contact type card type information device that is thin and capable of responding to an increase in storage capacity.

According to a further aspect of the invention, a manufacturing method of an antenna built-in module includes the steps of: forming on a wiring board a wiring pattern formed on at least one surface thereof and a conductive via connected to the wiring pattern; embedding a magnetic substance in the other surface of the wiring board; connecting an antenna terminal electrode and the conductive via by forming an antenna pattern having the antenna terminal electrode on the magnetic substance of the wiring board; and mounting a plurality of electronic components on the wiring pattern.

In addition, the antenna terminal electrode may be formed on a position other than that of the magnetic substance.

In addition, the manufacturing method may further include a step of forming an external connection terminal on the wiring board.

With this method, the magnetic substance is embedded in the surface of the wiring board opposite a surface on which the electronic components are mounted, and the wiring pattern is formed on the magnetic substance. Thus, it is possible to manufacture an antenna built-in module which is thin and has excellent antenna characteristics.

According to a still further aspect of the invention, a manufacturing method of a card type information device includes a step of mounting in a casing an antenna built-in module manufactured by the manufacturing method mentioned above.

With this method, it is possible to easily manufacture a contact or non-contact type card type information device that is thin and capable of responding to an increase in storage capacity.

Advantage of the Invention

According to the antenna built-in module, the card type information device, and the manufacturing methods for them of the present invention, it is possible to obtain a significant effect of easily achieving a decrease in thickness with excellent antenna characteristics even when the antenna is built in.

BRIEF DESCRIPTION OF THE DRAWINGS

FIG. 1A is a sectional view illustrating an antenna built-in module, and FIG. 1B is a sectional view illustrating an SD memory card equipped with the antenna built-in module shown in FIG. 1A, according to a first embodiment of the invention.

FIG. 2A is a perspective view illustrating a wiring board having an antenna pattern formed thereon, FIG. 2B is a sectional view taken along the line A-A shown in FIG. 2A, and FIG. 2C is a sectional view taken along the line B-B shown in FIG. 2A, according to the first embodiment of the invention.

FIGS. 3A-3F are sectional views illustrating a manufacturing method of the antenna built-in module according to the first embodiment of the invention.

FIGS. 4A and 4B are sectional views illustrating a manufacturing method of the antenna built-in module and the SD memory card according to the first embodiment of the invention.

FIG. 5A is a sectional view illustrating an antenna built-in module, and FIG. 5B is a sectional view illustrating an SD memory card equipped with the antenna built-in module shown in FIG. 5A, according to a modified example of the first embodiment of the invention.

FIG. 6A is a sectional view illustrating another variant of the antenna built-in module, and FIG. 6B is a sectional view illustrating an SD memory card equipped with the antenna built-in module shown in FIG. 6A, according to the first embodiment of the invention.

FIG. 7A is a sectional view illustrating an antenna built-in module, and FIG. 7B is a sectional view illustrating an SD memory card equipped with the antenna built-in module shown in FIG. 7A, according to a second embodiment of the invention.

FIG. 8A is a sectional view illustrating a variant of the antenna built-in module, and FIG. 8B is a sectional view illustrating an SD memory card equipped with the antenna built-in module shown in FIG. 8A, according to the second embodiment of the invention.

FIG. 9A is a perspective view illustrating a variant of a wiring board having an antenna pattern formed thereon, FIG. 9B is a sectional view taken along the line A-A shown in FIG. 9A, and FIG. 9C is a sectional view taken along the line B-B shown in FIG. 9A, according to a third embodiment of the invention.

BEST MODE FOR CARRYING OUT THE INVENTION

Hereinafter, embodiments of the invention will be described with reference to the drawings.

In addition, in order to facilitate understanding of the following description, the drawings will be enlarged optionally.

In addition, in the following embodiments, as a card type information device, an SD memory card (registered trademark) will be exemplarily described, but the invention is not limited to this.

First Embodiment

FIGS. 1 to 6 show a first embodiment of the invention.

Figure 1A:
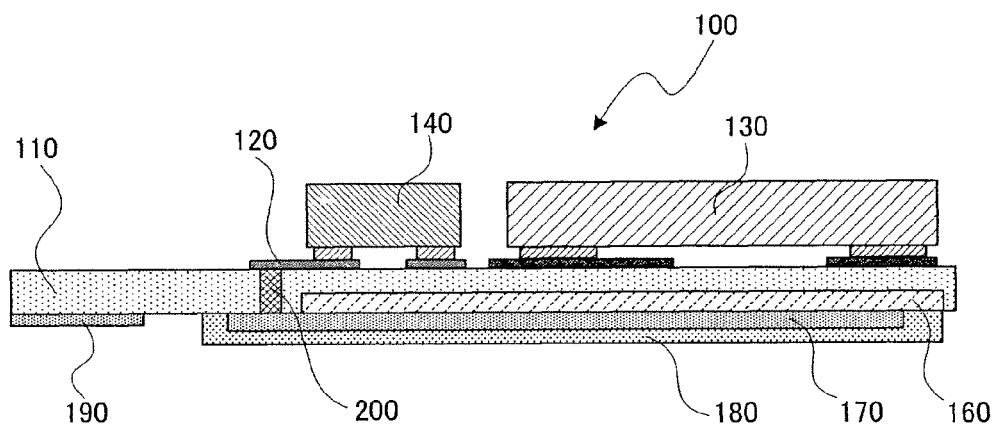
FIGS. 1A and 1B
Figure 1B:
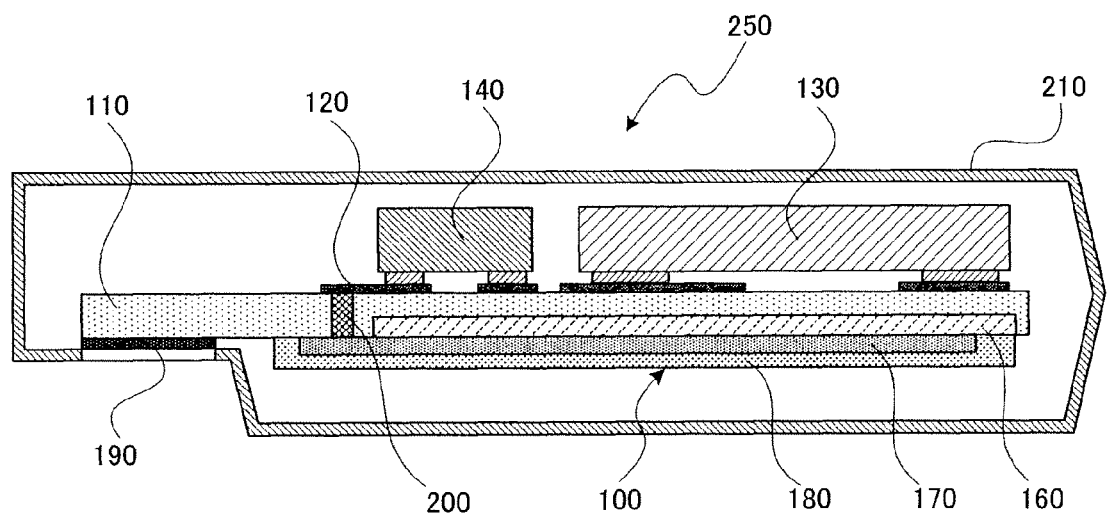

FIG. 1A is a sectional view illustrating an antenna built-in module, and FIG. 1B is a sectional view illustrating an SD memory card equipped with the antenna built-in module shown in FIG. 1A, according to the first embodiment of the invention.

As shown in FIG. 1A, in an antenna built-in module 100, a wiring pattern 120 made of, for example, silver paste and the like is formed on one surface of a wiring board 110 made of, for example, polyethylene terephthalate (PET) and the like, and a semiconductor storage element 130 such as a semiconductor memory and a plurality of electronic components such as a control element 140 for controlling the storage element and a capacitor (not shown) are mounted thereon. In addition, at least a magnetic substance 160 is embedded in the other surface of the wiring board 110 at a position opposed to the semiconductor storage element 130 and the control element 140. In addition, an antenna pattern 170 made of, for example, silver paste and the like is formed on the magnetic substance 160, and a protective layer 180 for protecting the antenna pattern 170 is formed as necessary. In addition, the antenna pattern 170 is connected to the wiring pattern 120 through a conductive via 200 formed on the wiring board 110.

In the vicinity of an end portion of the other surface of the wiring board 110, an external connection terminal 190 including a plurality of connection terminals for connecting with external devices is provided.

As described above, the antenna built-in module 100 is constituted.

As shown in FIG. 1B, the antenna built-in module 100 is mounted on a casing 210 made of, for example, polycarbonate/ABS alloy so that the external connection terminal 190 is exposed. Thus, a card type information device such as an SD memory card 250 is obtained.

In addition, it is preferred that the control element 140 have a high frequency circuit or the like for controlling transmission and reception in the antenna pattern 170. However, a semiconductor element for a high frequency circuit may be separately formed on the wiring board 110.

In addition, the antenna pattern 170 may be formed directly on the wiring board 110 and the magnetic substance 160, and also the antenna pattern 170 may be formed on, for example, a resin sheet (serving as the protective layer 180) by being bonded thereto. When the antenna pattern 170 is directly formed on the wiring board 110 and the magnetic substance 160, the magnetic substance 160 is preferably embedded in the wiring board 110 so that a surface of the magnetic substance 160 and the other surface of the wiring board 110 are in the same plane.

In addition, a concave portion may be formed on a predetermined position of the wiring board 110, and the magnetic substance 160 may be embedded in the concave portion, for example, by being bonded thereto or being filled therein. Here, for example, the predetermined position is defined as a region at least opposed to the semiconductor storage element 130 and the control element 140.

Next, the magnetic substance 160 and the antenna pattern 170 formed on the wiring board 110 will be described in detail with reference to FIGS. 2A-2C. In addition, the other components are omitted in FIGS. 2A-2C.

Figure 2A:
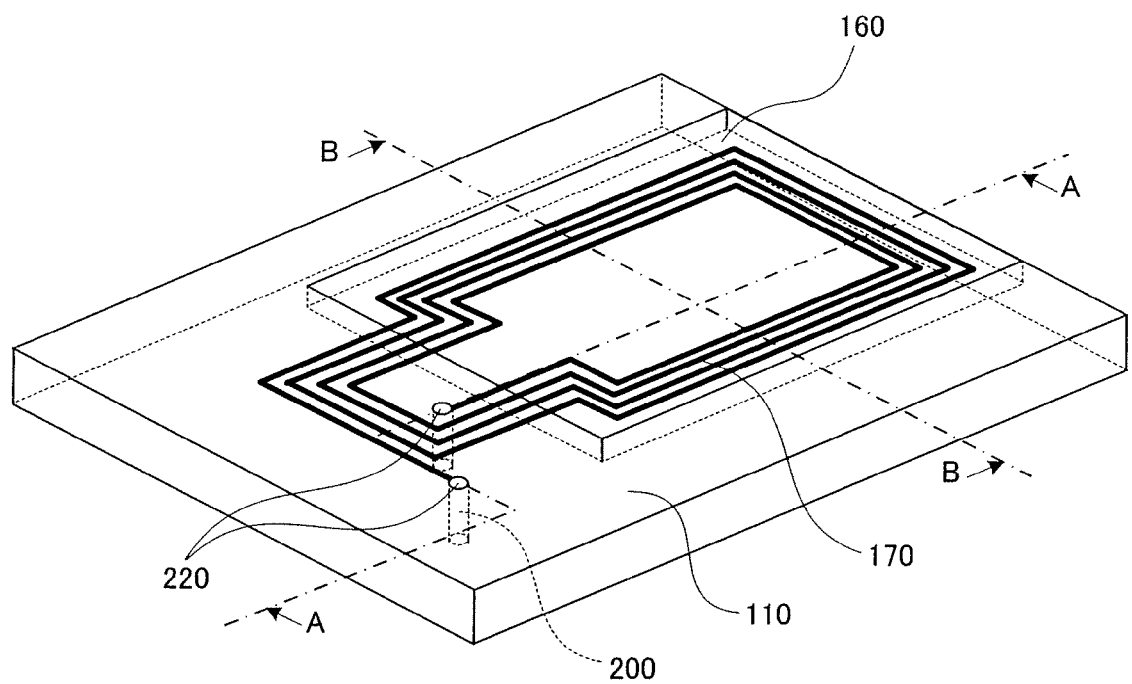
FIGS. 2A-2C
Figure 2B:
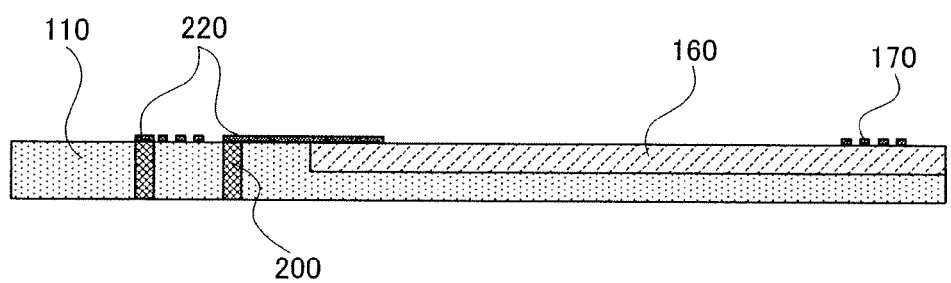
Figure 2C:
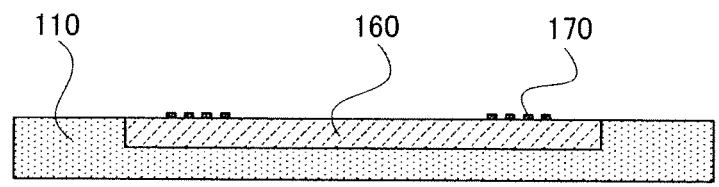

FIG. 2A is a perspective view illustrating the wiring board 110 having the antenna pattern formed thereon, FIG. 2B is a sectional view taken along the line A-A shown in FIG. 2A, and FIG. 2C is a sectional view taken along the line B-B shown in FIG. 2A.

As shown in FIGS. 2A-2C, the magnetic substance 160 made of a ceramic material such as ferrite is embedded in the other surface of the wiring board 110 made of, for example, PET and the like. In addition, for example, a principal part of the antenna pattern 170 having a loop shape is formed on the magnetic substance 160.

In addition, an antenna terminal electrode 220 of the antenna pattern 170 formed on a position outside the magnetic substance 160 of the wiring board 110 is connected to the conductive via 200 formed on the wiring board 110.

Here, the magnetic substance 160 is sheet-shaped, and also may be formed, for example, by printing and the like using, for example, paste containing magnetic substance powder. In addition, the magnetic substance 160 is preferably an insulator when the antenna pattern 170 is formed directly on the surface of the magnetic substance 160.

When a thickness of the wiring board 110 is in the range of, for example, 100 μm to 300 μm, a thickness of the magnetic substance 160 is set in the range of, for example, 50 μm to 200 μm. Hence, it is preferable that the magnetic substance 160 be made of a ceramic material or a metal oxide having magnetism such as ferrite, chrome oxide, cobalt oxide, nickel oxide, or the like having the thickness described above and high absorptivity with respect to electromagnetic waves. In addition, when an insulting film is formed on the magnetic substance 160, the magnetic substance 160 may be made of a magnetic metal. In addition, when a large thickness is allowed, it is possible to use a sheet in which, for example, magnetic substance powder such as ferrite powder is mixed into, for example, resin or synthetic rubber.

With such a configuration, radio waves incident on the antenna pattern 170 are absorbed by the magnetic substance 160, and thus do not reach the semiconductor storage element 130 and the like. As a result, incident waves of the radio waves do not interfere with waves reflected by the semiconductor storage element 130, and thus an SD memory card and an antenna built-in module having excellent antenna characteristics without loss are obtained.

In addition, by using the configuration in which the magnetic substance 160 is embedded in the wiring board 110, it is possible to make the antenna built-in module 100 thin.

In addition, the antenna terminal electrode 220 of the antenna pattern 170 is formed on the region outside the magnetic substance 160, and thus it is easy to form the conductive via 200, and it is not necessary to use, for example, laser or the like in order to form a through-hole for a conductive via on the magnetic substance made of a ceramic material which is difficult to be processed. As a result, it is possible to achieve simplicity in processes, and it is possible to form the through-hole on the magnetic substance 160 without heat generation and the like. Thus, it is possible to manufacture an antenna built-in module 100 having excellent reliability.

In addition, as a material of the wiring board 110, PET has been exemplarily described, but the invention is not limited to this. It is possible to use thermosetting resin such as polyphenylene ether resin, BT resin, epoxy resin, polyimide resin, fluorine resin, phenol resin, polyaminobismaleimide, or cyanate ester resin. In addition, it may be also possible to use thermoplastic resin such as vinyl chloride, polycarbonate, acrylonitrile butadiene styrene, or the like.

In addition, as a material of the wiring pattern 120 or antenna pattern 170, the silver paste has been exemplarily described, but the invention is not limited to this. In addition, it may be possible to form the patterns by using, for example, paste in which aluminum copper, silver, and the like are mixed, and it may be also possible to form the patterns by etching with metal foil such as aluminum foil or copper foil.

FIGS. 3A-3F and 4A-4B are sectional views illustrating a manufacturing method of the antenna built-in module 100 and the SD memory card 250 according to the first embodiment of the invention.

Figure 3A:
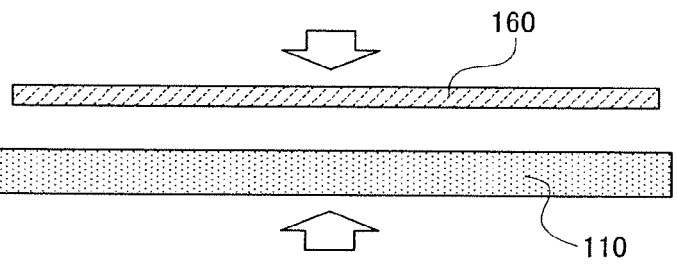
FIGS. 3A-3F
Figure 3B:
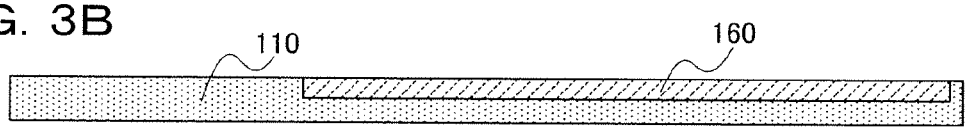

The manufacturing process proceeds as follows. First, as shown in FIG. 3A, the magnetic substance 160 having a predetermined shape such as a ferrite having a thickness of, for example, 100 μm is heated and pressed in a predetermined region of the wiring board 110 made of PET having a thickness of, for example, 200 μm by using a press machine, and is embedded as shown in FIG. 3B.

At this time, the heating temperature is required to be not more than Neel temperature or Curie temperature of the magnetic substance 160. In addition, when a conductor instead of an insulator is used in the magnetic substance 160, the magnetic substance 160 is covered with an insulating sheet and the like after being embedded.

Figure 3C:
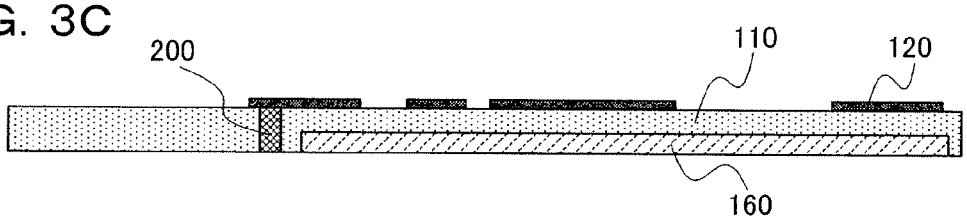

Next, as shown in FIG. 3C, the through-hole for the conductive via is formed on a predetermined position of the wiring board 110, by using, for example, a laser method or a drilling method. Here, the through-hole is formed in a region outside the region in which the magnetic substance 160 is embedded so as to interconnect the wiring pattern 120 and the antenna terminal electrode 220 of the antenna pattern 170.

In addition, silver paste is printed on one surface of the wiring board 110, for example, by using a screen printing method, and is filled into the through-hole. Thereby, the wiring pattern 120 is formed to have a thickness of, for example, 30 μm together with the conductive via 200 formed by filling the through-hole.

Figure 3D:
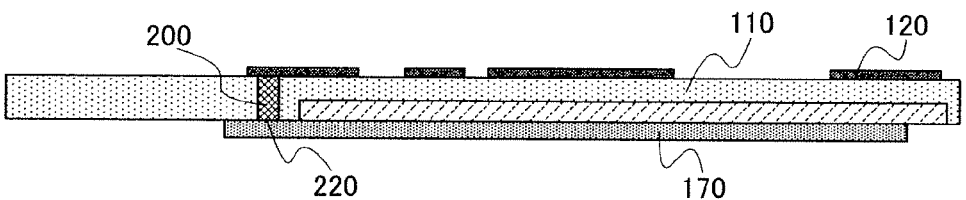

Next, as shown in FIG. 3D, on the other surface of the wiring board 110 and the magnetic substance 160, the antenna pattern 170 having, for example, a loop shape and the antenna terminal electrode 220 are formed of silver paste to have a thickness of, for example, 50 μm, for example, by using the screen printing method. Here, the antenna pattern 170 may be formed of conductive resin paste such as aluminum or copper. With such a configuration, the antenna pattern 170 and the wiring pattern 120 are electrically connected to each other through the conductive via 200 formed on the wiring board 110.

In addition, for the antenna pattern 170, a frequency band of 13.56 MHz is shown as an example, but the invention is not limited to this. For example, the antenna pattern may be formed as a dipole type antenna pattern, and there are no limitations when the pattern is formed in a shape appropriate for a required frequency band.

Figure 3E:
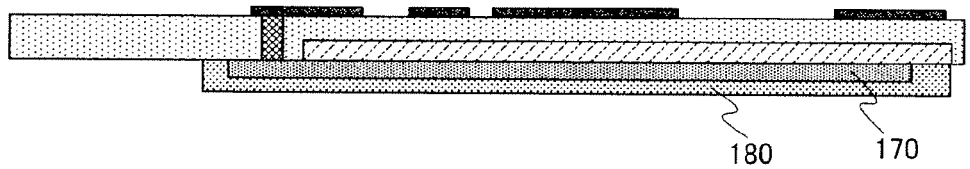

Next, as shown in FIG. 3E, in order to prevent deterioration in antenna characteristics and reliability caused by oxidation or migration of the antenna pattern 170, the protective layer 180 such as resist is formed, for example, by using the screen printing method. In addition, the process may be omitted when the omission does not affect antenna characteristics or reliability.

Figure 3F:
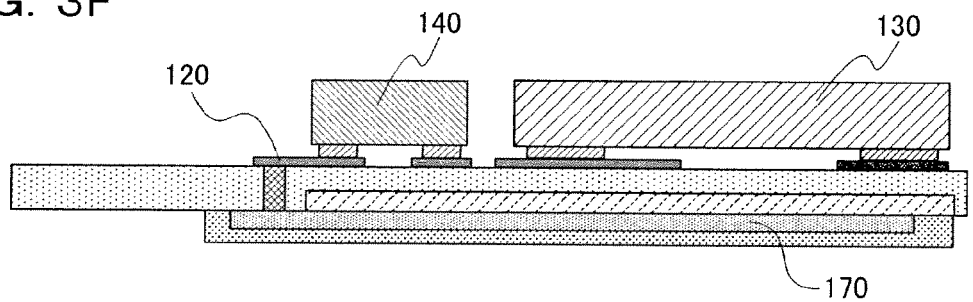

Next, as shown in FIG. 3F, at least one semiconductor storage element 130 such as a semiconductor memory and at least one control element 140 for controlling the semiconductor storage element are mounted on the wiring pattern 120, for example, by using a flip chip method. In this case, the control element 140 may have a high frequency circuit that performs transmission and reception by using the antenna pattern 170. In addition, a semiconductor element (not shown) such as a high frequency circuit may be mounted on a different position of the wiring pattern. In addition, in order to prevent erroneous operation caused by noise, for example, a capacitor (not shown) and the like may be mounted.

Figure 4A:
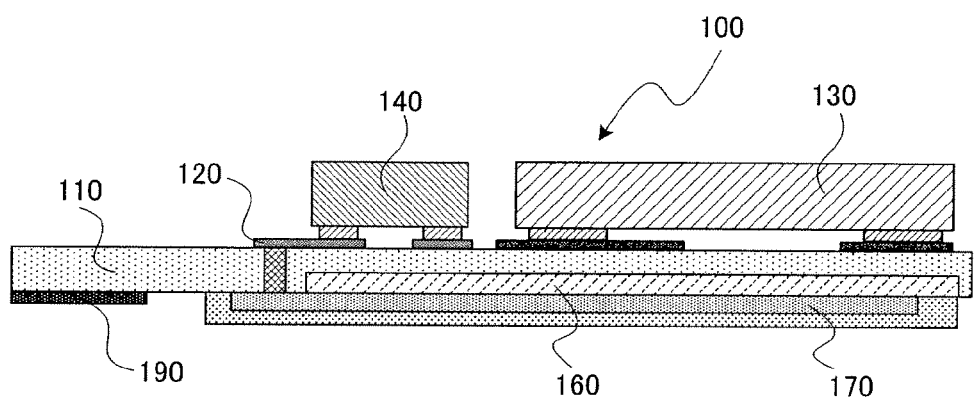
FIGS. 4A and 4B

Next, as shown in FIG. 4A, for example, in the vicinity of the end portion of the other surface of the wiring board 110, the external connection terminal 190 having a plurality of connection terminals is formed. In addition, the external connection terminal 190 is connected to the wiring pattern 120, for example, through a different conductive via (not shown) formed on the wiring board 110.

By the process mentioned above, the antenna built-in module 100 in which an antenna is built is manufactured.

In addition, in the description mentioned above, there has been described an example in which the antenna pattern 170 is formed directly on the magnetic substance 160, but the invention is not limited to this. The antenna pattern 170 provided with the antenna terminal electrode 220 on, for example, PET resin or the like is formed by a pattern made of, for example, copper foil, and may be formed by being aligned with and bonded to the conductive via formed on the wiring board.

Figure 4B:
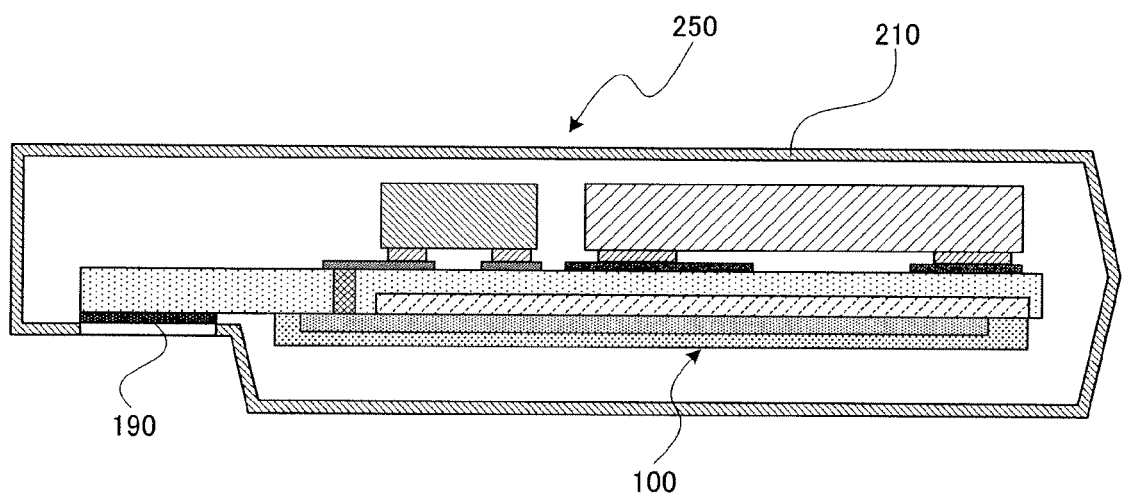

Next, as shown in FIG. 4B, the external connection terminal 190 is mounted on the antenna built-in module 100 to be exposed outside the casing 210 that includes, for example, an upper casing and a lower casing previously molded, for example, by polycarbonate/ABS alloy. In addition, for example, by ultrasonically welding the casing 210, the card type information device such as the SD memory card 250 is manufactured.

As described above, the magnetic substance 160 is embedded in the wiring board 110, and thus it is possible to easily manufacture a thin antenna built-in module and SD memory card formed.

In addition, in order to form the antenna terminal electrode 220 of the antenna pattern on the region outside the magnetic substance 160, it is not necessary to process a magnetic substance that has difficulty in processing of a through-hole or the like. Consequently, since there is no heat generated when the through-hole is formed on the magnetic substance, it is possible to manufacture the wiring board 110 at low temperature, and thus it is possible to manufacture the antenna built-in module and the SD memory card with excellent reliability by a simplified process.

Figure 5A:
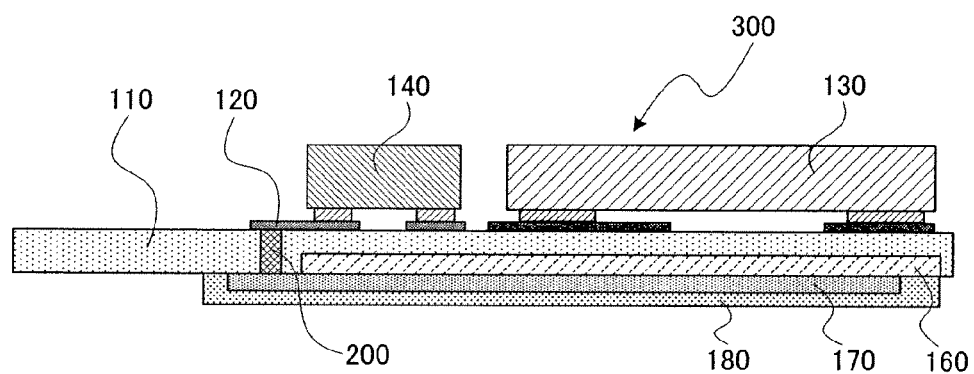
FIGS. 5A and 5B
Figure 5B:
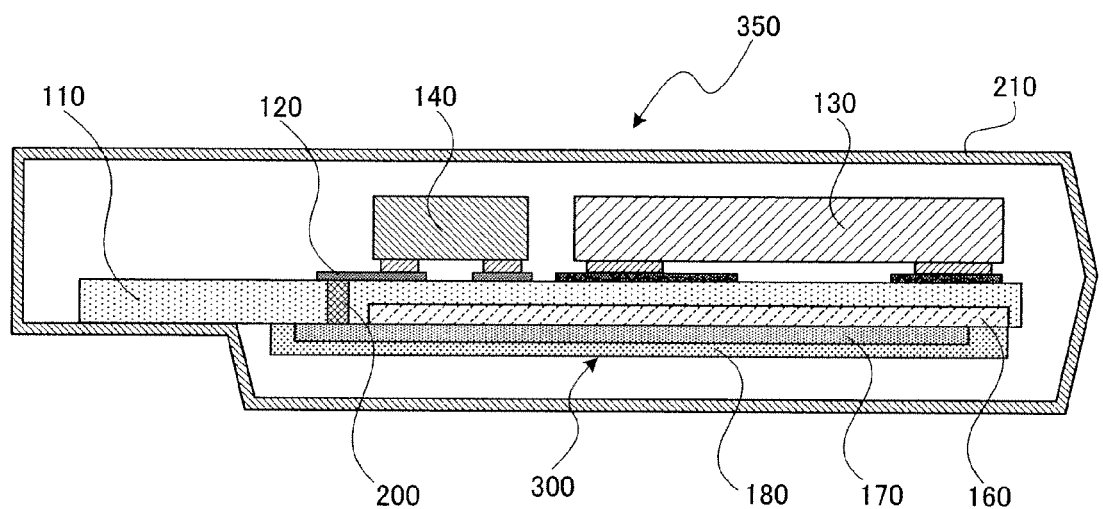

FIGS. 5A and 5B show an antenna built-in module 100 and an SD memory card 250 according to a modified example of the first embodiment. In addition, in an antenna built-in module 300 and an SD memory card 350 of the modified example shown in FIGS. 5A and 5B, the same elements as those in FIGS. 1A and 1B are denoted by the same reference numerals and signs.

FIG. 5A is a sectional view illustrating the antenna built-in module 300, and FIG. 5B is a sectional view illustrating the SD memory card 350 equipped with the antenna built-in module 300 shown in FIG. 5A.

In FIGS. 5A and 5B, the external connection terminal 190 shown in FIGS. 1A and 1B is not provided. The modified example is different in this point from the embodiment shown in FIGS. 1A and 1B.

That is, through the antenna pattern 170, electric power is supplied to the antenna built-in module 300 and information is transmitted and received, and other configurations are the same as the first embodiment. In addition, as necessary, it may be possible to provide a power supply (not shown) such as a battery on the wiring board 110.

With such a configuration, it is possible to make the antenna built-in module 300 and the SD memory card 350 thin, and it is also possible to achieve miniaturization thereof.

In addition, particularly, in the case of the SD memory card 350, the antenna built-in module 300 can be mounted by being enclosed in the casing 210, and thus it is possible to realize a card type information device having improved reliability in humidity resistance and resistance with respect to foreing matters.

Figure 6A:
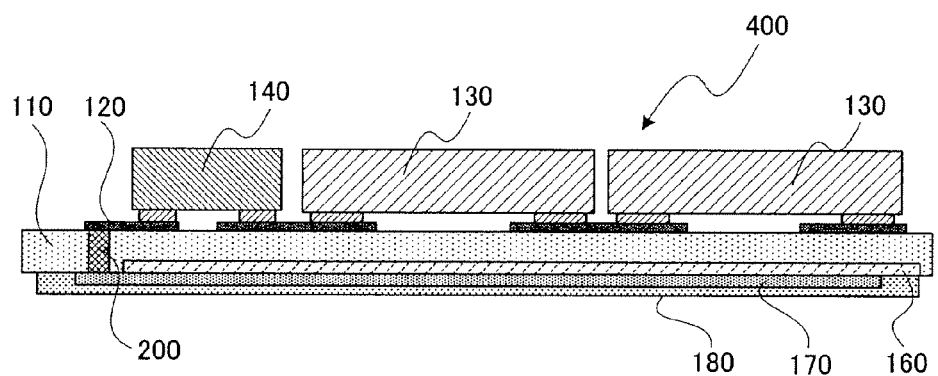
FIGS. 6A and 6B
Figure 6B:
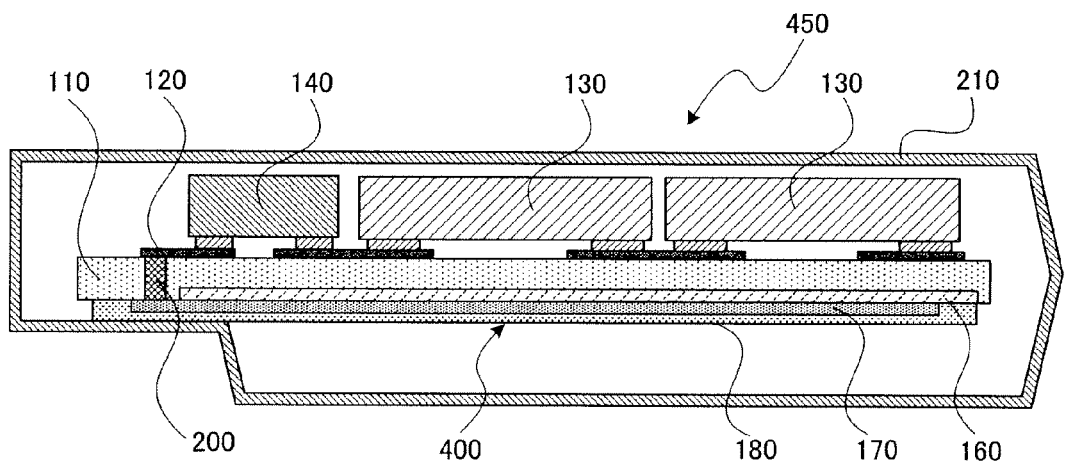

FIGS. 6A and 6B show another modified example according to the first embodiment.

When the outer shape of the SD memory card 350 is fixed according to a standard, it is possible to configure an antenna built-in module 400 as shown in FIG. 6A. FIG. 6B is a sectional view illustrating an SD memory card 450 equipped with the antenna built-in module 400.

That is, as shown in FIGS. 6A and 6B, since there is no external connection terminal, it is possible to increase the area of the magnetic substance 160 embedded in the wiring board 110. Thus, it is possible to increase an area on which a plurality of electronic components is mounted.

As a result, for example, by increasing the number of the semiconductor storage element 130 to be mounted on the one surface of the wiring board 110, it is possible to realize the antenna built-in module 400 and the SD memory card 450 of which storage capacities are increased more than those of the antenna built-in module 300 and the SD memory card 350.

Second Embodiment

Hereinafter, an antenna built-in module and an SD memory card according to a second embodiment of the invention will be described with reference to FIGS. 7A and 7B.

Figure 7A:
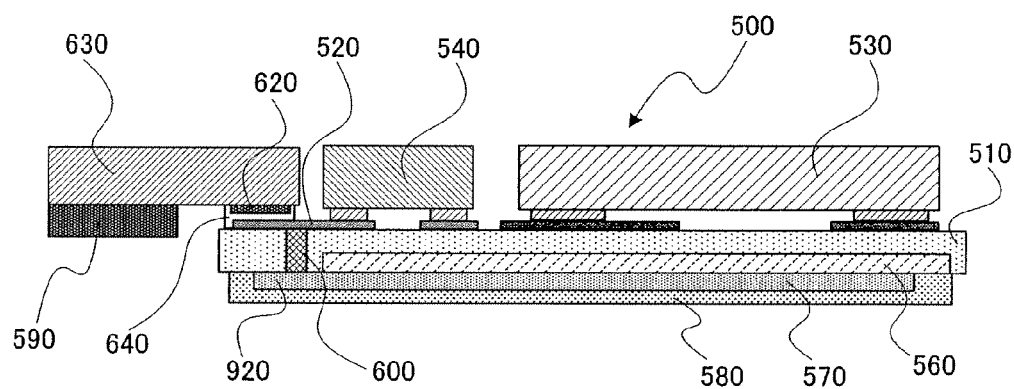
FIGS. 7A and 7B
Figure 7B:
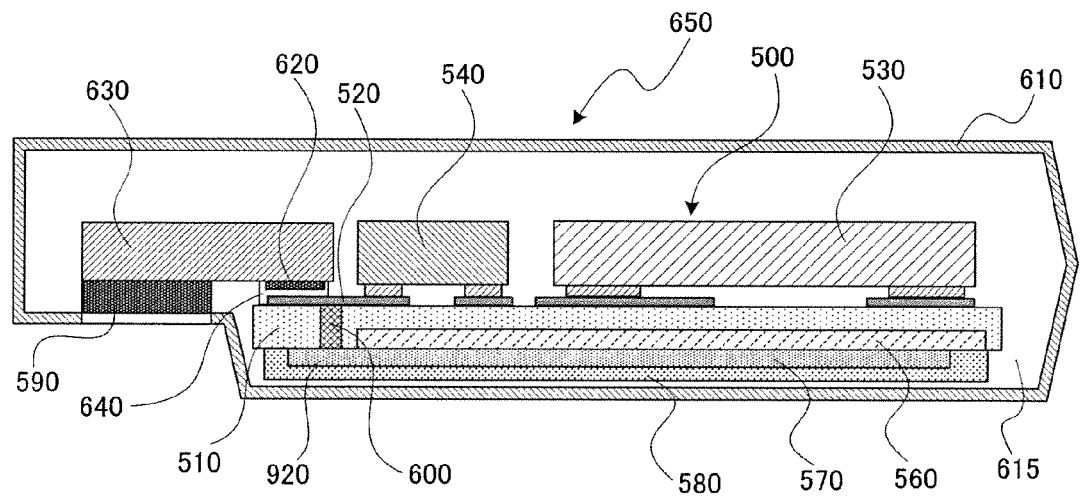

FIG. 7A is a sectional view illustrating an antenna built-in module 500, and FIG. 7B is a sectional view illustrating an SD memory card 650 equipped with the antenna built-in module 500 shown in FIG. 7A, according to the second embodiment of the invention.

As shown in FIG. 7A, in the antenna built-in module 500, a wiring pattern 520 made of, for example, silver paste and the like is formed on one surface of a wiring board 510 made of, for example, polyethylene terephthalate (PET) and the like, and a semiconductor storage element 530 such as a semiconductor memory and a plurality of electronic components such as a control element 540 for controlling the storage element and a capacitor (not shown) are mounted thereon. In addition, at least a magnetic substance 560 is embedded in the other surface of the wiring board 510 at a position opposed to the semiconductor storage element 530 and the control element 540. In addition, an antenna pattern 570 made of, for example, silver paste and the like is formed on the magnetic substance 560, and a protective layer 580 for protecting the antenna pattern 570 is formed as necessary. In addition, the antenna pattern 570 is connected to the wiring pattern 520 through a conductive via 600 formed on the wiring board 510.

In addition, the wiring pattern 520 formed on one surface of the wiring board 510 is connected to a substrate connection electrode 620 of a connection substrate 630 on which an external connection terminal 590 including a plurality of connection terminals for connecting with external devices is formed, via an adhesion member 640 such as conductive adhesive or an anisotropic conductive sheet.

Here, in the connection substrate 630, it is not necessary to embed a magnetic substance, and thus it is possible to employ a material having high rigidity. For example, it is possible to use a woven aramid fabric, a non-woven aramid fabric, a woven glass fabric, or a non-woven glass fabric as a connection substrate impregnated with epoxy resin.

As described above, the antenna built-in module 500 is constituted.

As shown in FIG. 7B, the antenna built-in module 500 is mounted on a casing 610 made of, for example, polycarbonate/ABS alloy so that the external connection terminal 590 is exposed. Consequently, a card type information device such as the SD memory card 650 is obtained.

In addition, it is preferable that the control element 540 have a high frequency circuit or the like for controlling transmission and reception in the antenna pattern 570. However, a semiconductor element for a high frequency circuit may be separately formed on the wiring board 510.

In addition, the antenna pattern 570 may be formed directly on the wiring board 510 and the magnetic substance 560, and the antenna pattern 570 may be formed on, for example, a resin sheet (serving as the protective layer 580) by being bonded thereto. When the antenna pattern 570 is formed directly on the wiring board, the magnetic substance 560 is preferably embedded in the wiring board 510 so that a surface of the magnetic substance 560 and the other surface of the wiring board 510 are in the same plane. In addition, a concave portion may be formed on a predetermined position of the wiring board 510, and the magnetic substance 560 is embedded in the concave portion, for example, by being bonded thereto. Here, for example, the predetermined position is defined as a region in which the semiconductor storage element 530 and the control element 540 at least exist.

As described above, according to the second embodiment of the invention, the wiring board on which the electronic components and the like are mounted is disposed on a recessed portion 615 of the casing 610, and thus it is possible to further achieve a decrease in the thickness of the SD memory card. In addition, the connection substrate and the wiring board are constituted of different materials, and thereby mechanical strength is improved by using the connection substrate having high rigidity. Thus, the antenna built-in module and the SD memory card having improved reliability against deformation and the like are obtained.

Figure 8A:
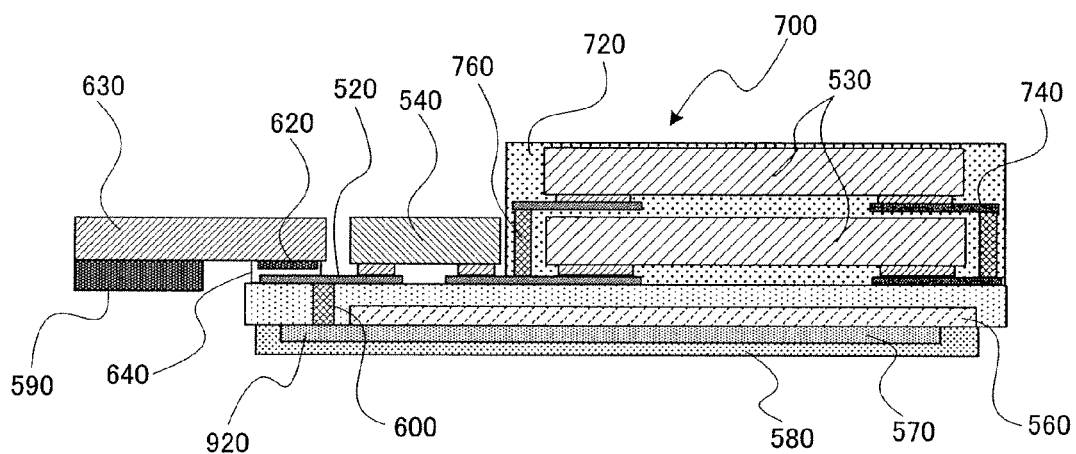
FIGS. 8A and 8B
Figure 8B:
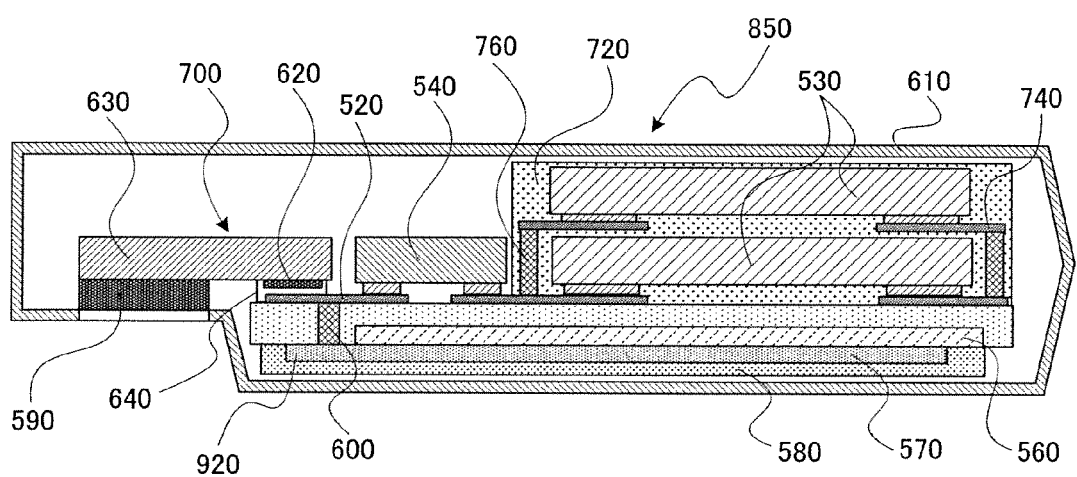

FIGS. 8A and 8B another modified example according to the second embodiment.

When the outer shape of the SD memory card 650 is fixed according to a standard, it is possible to configure an antenna built-in module 700 as shown in FIG. 8A. FIG. 8E is a sectional view illustrating an SD memory card 850 equipped with the antenna built-in module 700.

Specifically, as shown in FIGS. 8A and 8B, for example, the semiconductor storage element 530 is embedded in a resin layer 720, and a wire 740 formed in the resin layer 720 is connected to a conductive via 760 formed in the resin layer 720. Thus, it is possible to form a lamination structure of the semiconductor storage element 530.

With such a configuration, by a configuration in which the semiconductor storage element 530 standardized like the SD memory card is laminated in a limited space, it is possible to realize the antenna built-in module 700 and the SD memory card 850 of which storage capacities are increased more than those of the antenna built-in module 500 and the SD memory card 650.

Third Embodiment

In the embodiments described above, the antenna terminal electrode is exemplarily provided on the position in which the magnetic substance is not embedded, but the invention is not limited to this. For example, a magnetic substance is formed with synthetic rubber or resin in which magnetic substance powder such as ferrite powder is contained so that a through-hole and the like are easy to be processed. Alternatively, the magnetic substance is processed into a sheet shape having a through-hole and the like. In these cases, an antenna terminal electrode may be formed on the magnetic substance, and may be connected to a wiring pattern through a conductive via.

Figure 9A:
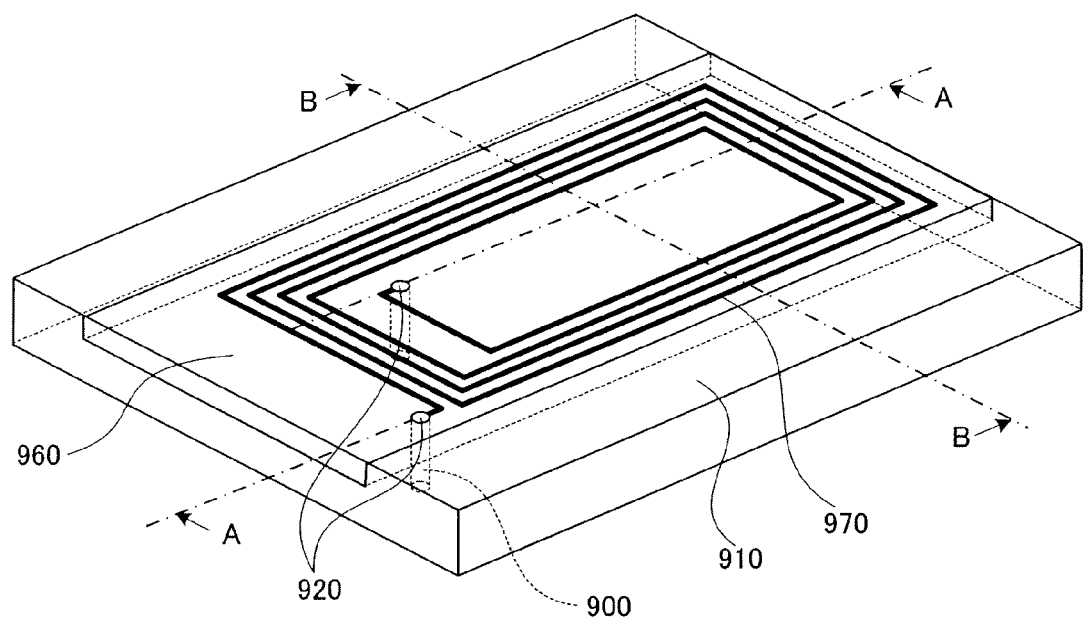
FIGS. 9A-9C
Figure 9B:
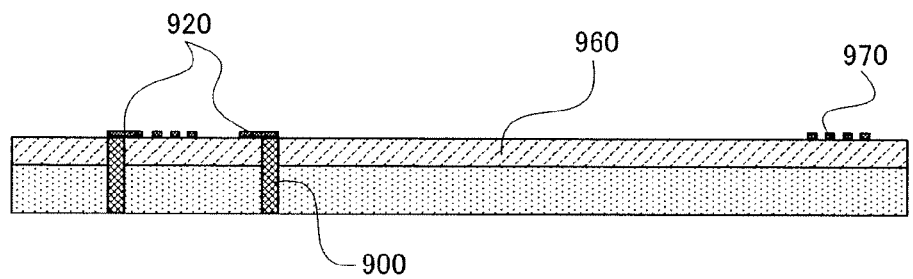
Figure 9C:
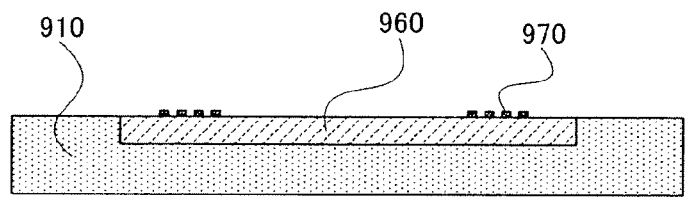

In a detailed example shown in FIG. 9A-9C, the magnetic substance and the antenna pattern formed on the wiring board are shown, and the other components are omitted.

FIG. 9A is a perspective view illustrating a variant of the wiring board having the antenna pattern formed thereon, FIG. 9B is a sectional view taken along the line A-A shown in FIG. 9A, and FIG. 9C is a sectional view taken along the line B-B shown in FIG. 9A, according to the embodiments of the invention.

A magnetic substance 960 made of, for example, ferrite having a through-hole (not shown) is embedded in the other surface of a wiring board 910 made of, for example, PET and the like. In addition, for example, an antenna pattern 970 having a looped antenna terminal electrode 920 is formed on the magnetic substance 960.

In addition, the antenna terminal electrode 920 of the antenna pattern 970 formed on the magnetic substance 960 of the wiring board 910 is connected to a conductive via 900 formed by filling the through-hole provided in the wiring board 910 and magnetic substance 960.

Here, the magnetic substance 960 may be formed by using a sheeted magnetic substance, and also may be formed, for example, by printing and the like using, for example, paste containing magnetic substance powder. In addition, a method of forming the antenna pattern 970, a method of embedding the magnetic substance 960 in the wiring board 910, and the like are the same as those described in the first embodiment.

With such a configuration, the antenna terminal electrode 920 and the antenna pattern 970 can be formed on the magnetic substance 960, and thus it is possible to reduce leakage field caused by the antenna pattern of a part outside the magnetic substance. In addition, it is possible to increase transmission and reception area of the antenna pattern, and thus communication sensitivity is improved. As a result, it is possible to realize the card type information device and the antenna built-in module having excellent antenna characteristics.

INDUSTRIAL APPLICABILITY

According to the invention, the antenna built-in module and the card type information device are useful in the fields of electronic devices including a non-contact type or a contact and non-contact type storage medium.

The invention claimed is:

1. An antenna built-in module comprising:
    a wiring board having a wiring pattern on one surface of the wiring board and which one surface has an electronic component mounted thereon;
    a magnetic substance embedded in the wiring board so that a surface of the magnetic substance and the other surface of the wiring board are in the same plane;
    an antenna pattern having a principal part on the surface of the magnetic substance, and an antenna terminal electrode at a position on the other surface of the wiring board other than the surface of the magnetic substance; and
    a conductive via through the wiring board at the other surface other than the surface of the magnetic substance, and connecting the antenna terminal electrode and the wiring pattern.

2. The antenna built-in module according to claim 1, wherein the electronic component includes at least a semiconductor storage element and a control element.

3. The antenna built-in module according to claim 1, wherein an external connection terminal is formed on the wiring board.

4. The antenna built-in module according to claim 1, wherein a connection substrate having an external connection terminal is formed on the wiring board.

5. The antenna built-in module according to claim 1, wherein the magnetic substance is formed on at least a region provided with a plurality of the electronic components.

6. A card type information device comprising the antenna built-in module according to claim 1 mounted in a casing.

7. A manufacturing method of an antenna built-in module comprising:
    embedding a magnetic substance in a wiring board so that a surface of the magnetic substance and a first surface of the wiring board are in the same plane;
    forming a wiring pattern on a second surface of the wiring board, and a conductive via through the wiring board at other than the surface of the magnetic substance, said conductive via connected to the wiring pattern;
    connecting an antenna terminal electrode and the conductive via by forming an antenna pattern having a principal part formed on the surface of the magnetic substance, and the antenna terminal electrode formed at a position on the first surface of the wiring board other than the surface of the magnetic substance; and
    mounting a plurality of electronic components on the wiring pattern.

8. The manufacturing method of the antenna built-in module according to claim 7, further comprising a step of forming an external connection terminal on the wiring board.

9. A manufacturing method of a card type information device comprising a step of mounting in a casing an antenna built-in module manufactured by the manufacturing method according to claim 7.

* * * * *